US011769674B2

(12) United States Patent
Wu

(10) Patent No.: US 11,769,674 B2
(45) Date of Patent: Sep. 26, 2023

(54) METHOD FOR FABRICATING SEMICONDUCTOR INTERCONNECT STRUCTURE AND SEMICONDUCTOR STRUCTURE THEREOF

(71) Applicant: Changxin Memory Technologies, Inc., Anhui (CN)

(72) Inventor: Pingheng Wu, Hefei (CN)

(73) Assignee: Changxin Memory Technologies, Inc., Hefei (CN)

( * ) Notice: Subject to any disclaimer, the term of this patent is extended or adjusted under 35 U.S.C. 154(b) by 216 days.

(21) Appl. No.: 17/236,933

(22) Filed: Apr. 21, 2021

(65) Prior Publication Data
US 2021/0242037 A1 Aug. 5, 2021

Related U.S. Application Data

(63) Continuation of application No. PCT/CN2019/121911, filed on Nov. 29, 2019.

(30) Foreign Application Priority Data

Nov. 30, 2018 (CN) .......................... 201811460134.6
Nov. 30, 2018 (CN) .......................... 201822028209.5

(51) Int. Cl.
*H01L 21/48* (2006.01)
*H01L 21/768* (2006.01)
(Continued)

(52) U.S. Cl.
CPC ...... *H01L 21/486* (2013.01); *H01L 21/76871* (2013.01); *H01L 21/76877* (2013.01);
(Continued)

(58) Field of Classification Search
CPC ............ H01L 21/486; H01L 21/76877; H01L 23/5226; H01L 2225/06541; H01L 25/0657; H01L 21/76898
See application file for complete search history.

(56) References Cited

U.S. PATENT DOCUMENTS 7,446,420 B1 11/2008 Kim
9,743,526 B1 8/2017 Blackshear et al.
(Continued)

FOREIGN PATENT DOCUMENTS

CN 209045544 U 6/2019
GN 101330076 A 12/2008

OTHER PUBLICATIONS

PCT International Search Report and the Written Opinion dated Feb. 26, 2020, issued in related International Application No. PCT/CN2019/121911 (7 pages).

*Primary Examiner* — Phat X Cao
(74) *Attorney, Agent, or Firm* — Sheppard Mullin Richter & Hampton LLP

(57) ABSTRACT

A semiconductor interconnect structure and a fabricating method thereof are disclosed. The method comprises: providing a stacked structure comprising bonded multiple layers of wafer or die, each bonded layer comprises a substrate and a wiring layer, and the wiring layer comprises metal wires; vertically forming, in the stacked structure, a first blind hole having a first diameter and a first length and penetrating each bonded layer between adjacent metal wires, the first diameter is less than a space between the adjacent metal wires, and the first length is less than a height of the stacked structure; forming a second blind hole having a second diameter and the first length coaxially with the first blind hole, a sidewall of the second blind hole exposes the metal wires, and the second diameter is larger than the space
(Continued)

between the adjacent metal wires; and filling a conductive material in the second blind hole.

10 Claims, 12 Drawing Sheets

(51) Int. Cl.
  *H01L 23/522* (2006.01)
  *H01L 25/065* (2023.01)
  *H01L 23/00* (2006.01)
(52) U.S. Cl.
  CPC .... *H01L 21/76898* (2013.01); *H01L 23/5226* (2013.01); *H01L 24/11* (2013.01); *H01L 24/14* (2013.01); *H01L 25/0657* (2013.01)

(56) References Cited

U.S. PATENT DOCUMENTS

| | | | |
|---|---|---|---|
| 2009/0065907 A1 | 3/2009 | Haba et al. | |
| 2012/0168935 A1* | 7/2012 | Huang | H01L 21/6835 |
| | | | 438/455 |
| 2015/0121693 A1 | 5/2015 | Huang et al. | |
| 2016/0005713 A1* | 1/2016 | Chen | H01L 21/6835 |
| | | | 438/109 |

* cited by examiner

100

| S102 | providing a stacked structure comprising bonded multiple layers of wafer or chip, wherein each layer of wafer or chip comprises a substrate and a wiring layer, and the wiring layer comprises a plurality of metal wires |

↓

| S104 | vertically forming, in the stacked structure, a first blind hole having a first diameter and a first length, wherein a penetration position of the first blind hole in each layer of wafer or chip is between adjacent metal wires, the first diameter is less than a space between the adjacent metal wires, and the first length is less than a height of the stacked structure |

↓

| S106 | forming a second blind hole having a second diameter and the first length coaxially with the first blind hole, wherein a sidewall of the second blind hole exposes end surfaces of the plurality of metal wires, and the second diameter is larger than the space between the adjacent metal wires |

↓

| S108 | filling a conductive material in the second blind hole |

Fig. 1

METHOD FOR FABRICATING SEMICONDUCTOR INTERCONNECT STRUCTURE AND SEMICONDUCTOR STRUCTURE THEREOF

CROSS-REFERENCE TO RELATED APPLICATIONS

This application is a continuation application of International Patent Application No. PCT/CN2019/121911, filed on Nov. 29, 2019, which is based on and claims priority to and benefits of the Chinese Patent Applications No. 201811460134.6 and No. 201822028209.5, both filed with the China National Intellectual Property Administration (CNIPA) of the People's Republic of China on Nov. 30, 2018. The entire contents of the above-referenced applications are incorporated herein by reference.

TECHNICAL FIELD

The present disclosure relates to the field of integrated circuit (IC) fabrication technology, and in particular to a method for fabricating a semiconductor interconnect structure and a semiconductor structure thereof.

BACKGROUND

In integrated circuit manufacturing, stacking multiple chips and establishing mechanical and electrical connections among them is an important way to reduce the size of integrated circuits. The current technology is fabricating Through Silicon Vias (TSVs) for each chip to be stacked, and then forming a bump (Micro-Bump) for each TSV. The chips then are bonded through a die-to-die or die-to-wafer approach, using the bumps and the TSVs for electrically connecting the stacked multiple chips.

First of all, the die-to-die or die-to-wafer bonding process has low efficiency and high cost. In addition, the TSVs for each chip need to be pre-fabricated, and the bumps need to be formed at the TSVs accordingly. As such, the bonding process has the high risks of alignment and connection errors, and the electrical connection paths between the upper and lower layers can be easily broken, resulting in low yield.

Therefore, there is a need for a solution of inter-layer electrical connections or interconnection that overcomes the above issues.

It is to be noted that the above information disclosed in this Background section is only for enhancement of understanding of the background of the invention, and therefore may contain information that does not form the prior art that is already known to a person of ordinary skill in the art.

SUMMARY OF THE INVENTION

The present disclosure provides a method for fabricating a semiconductor interconnection structure and a semiconductor structure thereof, to overcome the problems of complicated manufacturing process and the low yield of the semiconductor interconnect structure due to limitations and defects of related art.

A first aspect of embodiments of the present disclosure may direct to a method for a fabricating semiconductor interconnection structure. The method may include: providing a stacked structure comprising bonded multiple layers of wafer or die, wherein each layer of wafer or die comprises a substrate and a wiring layer, and the wiring layer comprises a plurality of metal wires; vertically forming, in the stacked structure, a first blind hole having a first diameter and a first length, wherein a penetration position of the first blind hole in each layer of wafer or die is between adjacent metal wires, the first diameter is less than a space between the adjacent metal wires, and the first length is less than a height of the stacked structure; forming a second blind hole having a second diameter and the first length coaxially with the first blind hole, wherein a sidewall of the second blind hole exposes end surfaces of the plurality of metal wires, and the second diameter is larger than the space between the adjacent metal wires; and filling a conductive material in the second blind hole.

In an exemplary embodiment of the present disclosure, forming the second blind hole having the second diameter and the first length coaxially with the first blind hole may comprise widening a portion of the first blind hole in the substrate of each layer of wafer or die to the second diameter by a first wet etch process, and extending, by a second wet etching process, a portion of the first blind hole in the wiring layer of each layer of wafer or die to the second diameter to expose the end surfaces of the plurality of metal wires to form the second blind hole.

In an exemplary embodiment of the present disclosure, filling the conductive material in the second blind hole may comprise forming a dielectric isolation layer on an inner surface of the second blind hole, and etching the dielectric isolation layer to expose the end surfaces of the plurality of metal wires and a bottom of the second blind hole.

In an exemplary embodiment of the present disclosure, forming the dielectric isolation layer may comprise depositing SiCN on the inner surface of the second blind hole by a chemical vapor deposition process.

In an exemplary embodiment of the present disclosure, etching the dielectric isolation layer to expose the end surfaces of the plurality of metal wires and the bottom of the second blind hole may comprise by a plasma dry etch process, etching portions of the dielectric isolation layer on the end surfaces and upper surfaces of the plurality of metal wires to expose the plurality of metal wires, and etching a portion of the dielectric isolation layer at the bottom of the second blind hole to expose the bottom of the second blind hole.

In an exemplary embodiment of the present disclosure, filling the conductive material in the second blind hole may comprise sputtering a seed metal on the etched dielectric isolation layer and the exposed end surfaces of the plurality of metal wires and the bottom of the second blind hole, wherein the seed metal may comprise tantalum or copper, and growing the conductive metal in the second blind holes sputtered with the seed metal, the conductive metal may comprise copper.

In an exemplary embodiment of the present disclosure, the method may further include grinding a bottom layer of the stacked structure to expose a metal filled at a bottom of the second blind hole, and forming a bump on a surface of the exposed metal.

In an exemplary embodiment of the present disclosure, each of the first blind hole and the second blind hole may have a cross-sectional top view of a circle shape, a polygon shape, and an irregular shape.

In an exemplary embodiment of the present disclosure, the multiple layers of wafer or die may be directly bonded, wherein a substrate of a top layer is directly disposed on a wiring layer of a lower layer.

In an exemplary embodiment of the present disclosure, a difference between the first diameter and the space between the adjacent metal wires may be within a first preset safe range, and a difference between the second diameter and the space between the adjacent metal wires is within a second preset safe range.

A second aspect of the present disclosure may direct to a semiconductor structure. The semiconductor structure may include: a stacked structure comprising bonded multiple layers of wafer or die, each layer of wafer or die comprising a substrate and a wiring layer, and the wiring layer comprising a plurality of metal wires; and at least a through silicon via (TSV) penetrating the bonded multiple layers of wafer or die of the stacked structure, a center of a penetration position on each layer of wafer or die being located between adjacent metal wires, and a sidewall of the through silicon via intersecting with the plurality of metal wires. The through silicon via penetrating the bonded multiple layers of wafer or die of the stacked structure may be fabricated by a method including one single etching process disclosed above.

In an exemplary embodiment of the present disclosure, the through silicon via may have a cross-sectional top view of a circle shape, a polygon shape, or an irregular shape.

In an exemplary embodiment of the present disclosure, the through silicon via penetrating the bonded multiple layers of wafer or die may be a one-piece structure formed integrally.

In an exemplary embodiment of the present disclosure, the through silicon via penetrating the bonded multiple layers of wafer or die may comprise no bumps among the bonded multiple layers of wafer or die.

In an exemplary embodiment of the present disclosure, a difference between a diameter of the through silicon via and a space between the adjacent metal wires may be within a preset safe range.

In an exemplary embodiment of the present disclosure, the diameter of the through silicon via is consistent in each of the bonded plurality of layers of wafer or die.

In an exemplary embodiment of the present disclosure, a dielectric isolation layer may be disposed on an inner surface of the through silicon via, and the dielectric isolation layer may expose end surfaces of the plurality of metal wires.

In an exemplary embodiment of the present disclosure, a seed metal may be sputtered on the dielectric isolation layer and the exposed end surfaces of the plurality of metal wires, and the seed metal may comprise tantalum or copper.

In an exemplary embodiment of the present disclosure, the through silicon via may be filled with a conductive metal, and the conductive metal may comprise copper.

A third aspect of the present disclosure may direct to a semiconductor structure including the semiconductor interconnect structure disclosed above and fabricated by the method disclosed above.

A method for fabricating a semiconductor interconnect structure provided by an embodiment of the present disclosure forms a blind hole penetrating a stacked structure for a bonded wafer or die and expands the blind hole by wet etching to expose the end faces of the wires or chips in the stacked structure. Finally, the conductive material is filled in the blind hole to form the TSV connecting the leads, and the interconnect structure connecting the wires in each wafer or die can be fabricated by one etching process, thereby avoiding the use of bumps in the related art to realize the electrical connection between the chips. The process is complicated, and the connection yield is low.

It is to be understood that both the foregoing general description and the following detailed description are exemplary and explanatory only and are not restrictive to this present disclosure.

BRIEF DESCRIPTION OF THE DRAWINGS

The accompanying drawings, which are incorporated in and constitute a part of the present disclosure, illustrate embodiments consistent with the present disclosure and, together with the description, serve to explain the principles disclosed in the present disclosure. It is apparent that these drawings present only some embodiments of the present disclosure and those of ordinary skill in the art may obtain drawings of other embodiments from the accompanying drawings without exerting any creative effort.

FIG. 1 is a flow chart of a method for fabricating a semiconductor interconnection structure in an embodiment of the present disclosure.

DETAILED DESCRIPTION

Figure 2:
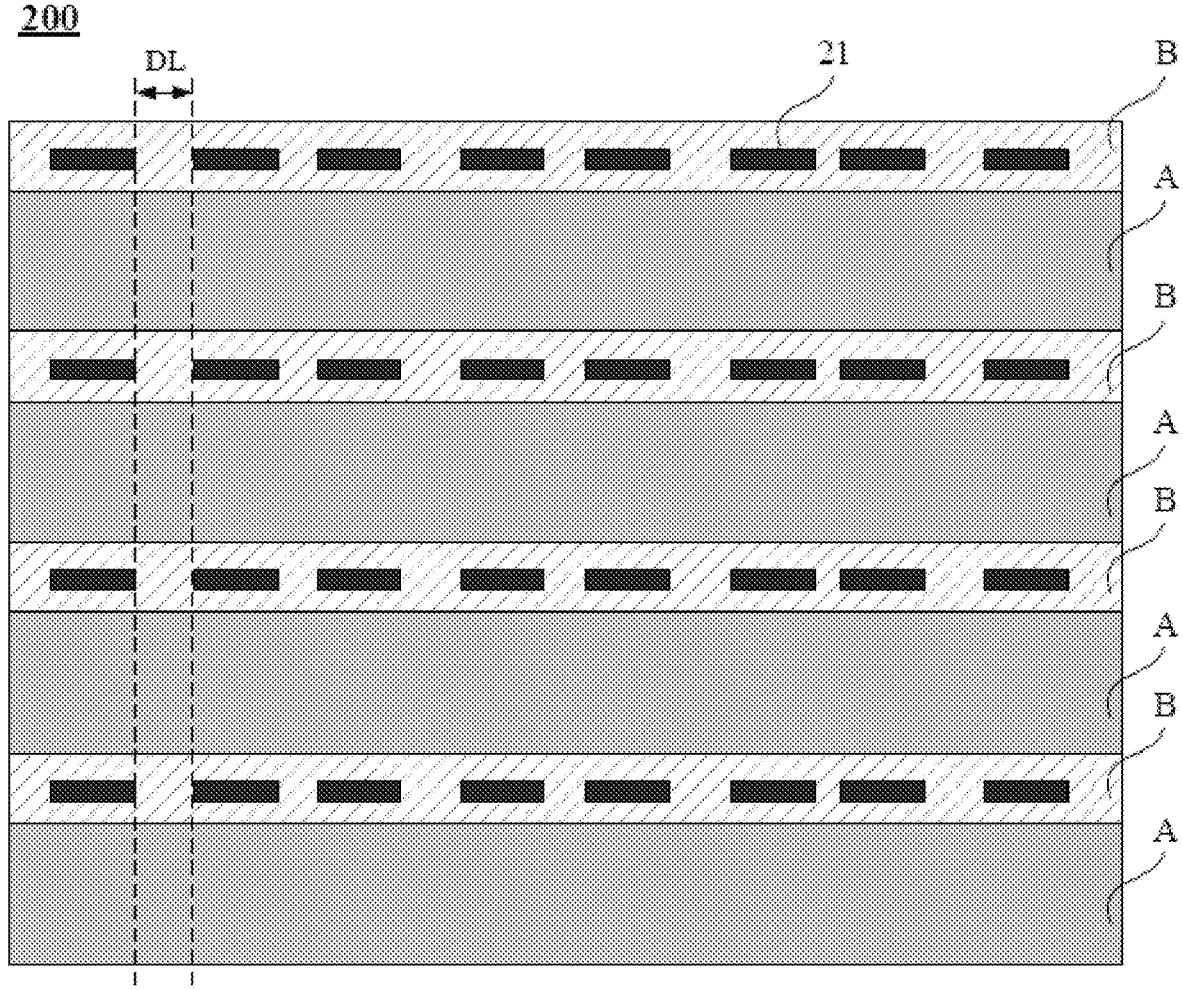
FIG. 2 is a schematic diagram of the structure in step S102 in an embodiment of the present disclosure.

Exemplary embodiments will now be described more fully with reference to the accompanying drawings. However, these exemplary embodiments can be implemented in many forms and should not be construed as being limited to those set forth herein. Rather, these embodiments are presented to provide a full and thorough understanding of the present disclosure and to fully convey the concepts of the embodiments to others skilled in the art. In addition, the described features, structures, and characteristics may be combined in any suitable manner in one or more embodiments. In the following detailed description, many specific details are set forth to provide a more thorough understanding of the present disclosure. However, those skilled in the art will recognize that the various embodiments can be practiced without one or more of the specific details or with other methods, components, materials, or the like. In some instances, well-known structures, materials, or operations are not shown or not described in detail to avoid obscuring aspects of the embodiments.

Further, the annexed drawings are merely illustrative to the present disclosure and are not necessarily drawn to scale. Throughout the figures, like reference numbers indicate identical or similar elements, so any duplicate description of them will be omitted. The represented blocks in the figures are purely functional entities, which do not necessarily correspond to physically separate entities. In other words, these functional entities may be implemented as software, or entirely or partially in one or more software-hardened modules, or in different networks and/or processor devices and/or microcontroller devices.

The embodiments of the present disclosure will be described in detail below with reference to the accompanying drawings.

FIG. 1 shows a flow chart of a method for fabricating a semiconductor interconnection structure in an embodiment of the present disclosure. Referring to FIG. 1, the method 100 can include the following steps.

In Step S102, a stacked structure including bonded multiple layers of wafer or die is provided. A wiring layer, such as a redistribution layer (RDL), may be disposed on an upper surface of each layer of the wafer or die, and the wiring layer may include a plurality of metal wires.

In Step S104, in the stacked structure, a first blind hole having a first diameter and a first length may be formed vertically, and the position for the first blind hole penetrating each layer of the wafer or die may be located between the metal wires. The first diameter is less than a space between the adjacent metal wires.

In Step S106, a second blind hole having a second diameter and the first length may be formed coaxially with the first blind hole, so that end surfaces of some of the plurality of metal wires may be exposed from the sidewall of the second blind hole. The second diameter is greater than the space between the metal wires.

In Step S108, a conductive material may be filled in the second blind hole.

The method for fabricating a semiconductor interconnect structure provided by an embodiment of the present disclosure may form a blind hole penetrating the stacked structure having bonded layers of wafers or chips, and expand the blind hole by wet etching to expose the end surfaces of the metal wires in layers of wafer or the chip of the stacked structures. The blind hole then is filled with the conductive material to form the TSV connecting the metal wires of different layers. The interconnect structure connecting the metal wires in each layer of wafer or the chip can be fabricated by one single etching process, thereby avoiding bumps used in the inter-chip electrical connection in the related art. The problems of a complicated process and low connection yield caused by the inter-chip electrical connection with bumps can be prevented and the cost and time for manufacturing the 3D integrated circuit can be reduced.

Each step of the method 100 will be described in detail.

FIG. 2 is a schematic diagram of a stacked structure 200 provided in Step S102. It can be understood that the process of fabricating the stacked structure 200 (for example, bonding each wafer or die) may be conducted before Step S102, which is not described herein.

Referring to FIG. 2, the stacked structure 200 may include a wafer stacked structure or a chip stacked structure. A wafer stacked structure may be preferred in some of the embodiments of the present disclosure. Each layer of the wafer or die in the stacked structure 200 may include a substrate A and a wiring layer B. The wiring layer B includes a plurality of metal wires 21. In the embodiments of the present disclosure, a TSV may be formed for connecting the metal wires 21 at the corresponding positions of each layer, so as to electrically connect the layers of wafer or die. As shown in FIG. 2, each wafer or die may be bonded directly, avoiding the cumbersome process of forming TSVs and bumps in the related art.

Figure 3:
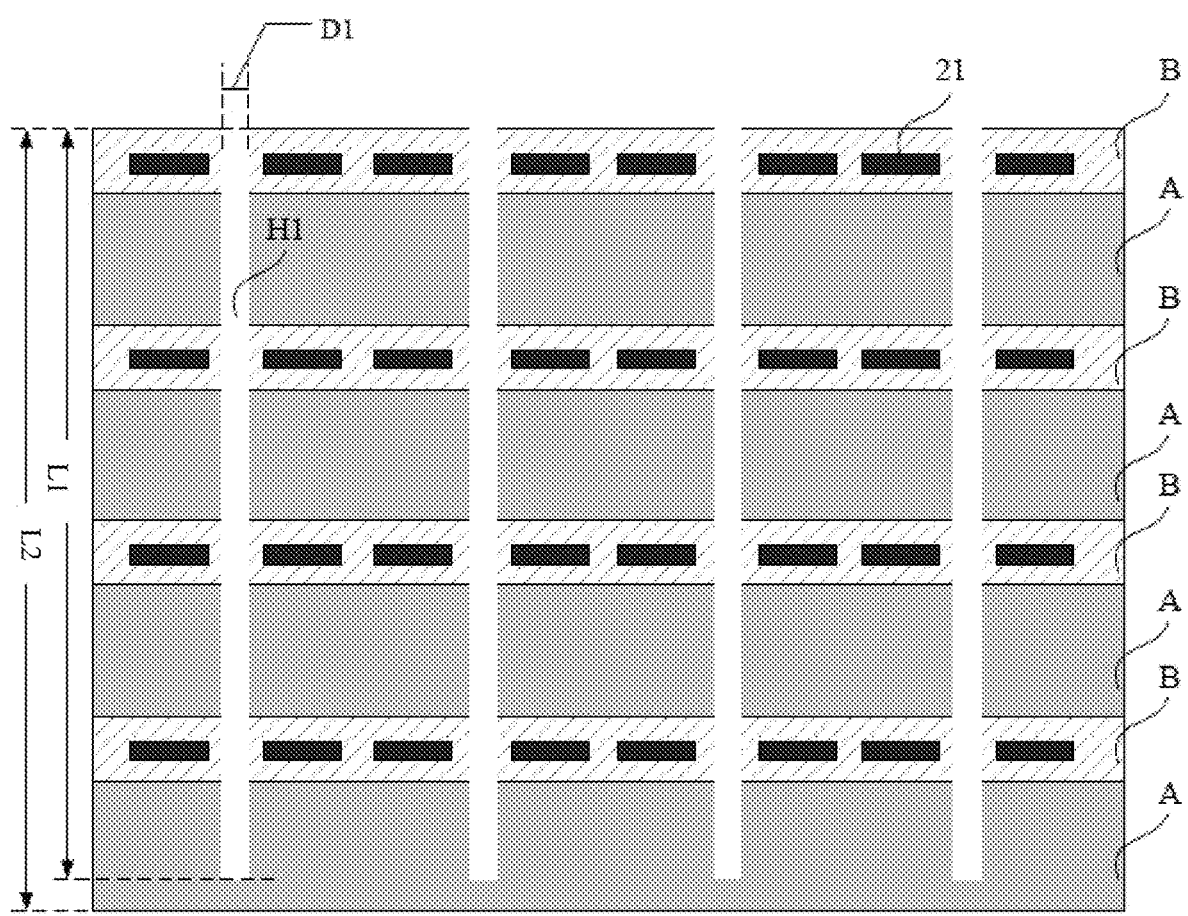
FIG. 3 is a schematic diagram of the structure in step S104 in an embodiment of the present disclosure.

FIG. 3 is a schematic diagram of the first blind hole H1 having the first diameter D1 and the first length L1 vertically formed in the stacked structure 200 in step S104. Referring to FIG. 3, the penetration position of the first blind hole H1 in each layer of the wafer or die is located between the adjacent metal wires, and the first diameter D1 is smaller than the space DL between the adjacent metal wires. The first length L1 is shorter than the height L2 of the stacked structure. The first diameter D1 may be determined according to the space DL between the adjacent metal wires as long as the difference between D1 and DL is greater than a preset safety distance to avoid etching to the metal wires.

When a plurality of interconnect structures needs to be fabricated, a plurality of first blind holes H1 can be fabricated in the stacked structure 200. The first blind hole can be formed by, for example, a process including gluing, photolithography, development, etching, etc., and the present disclosure is not particularly limited to.

Figure 4A:
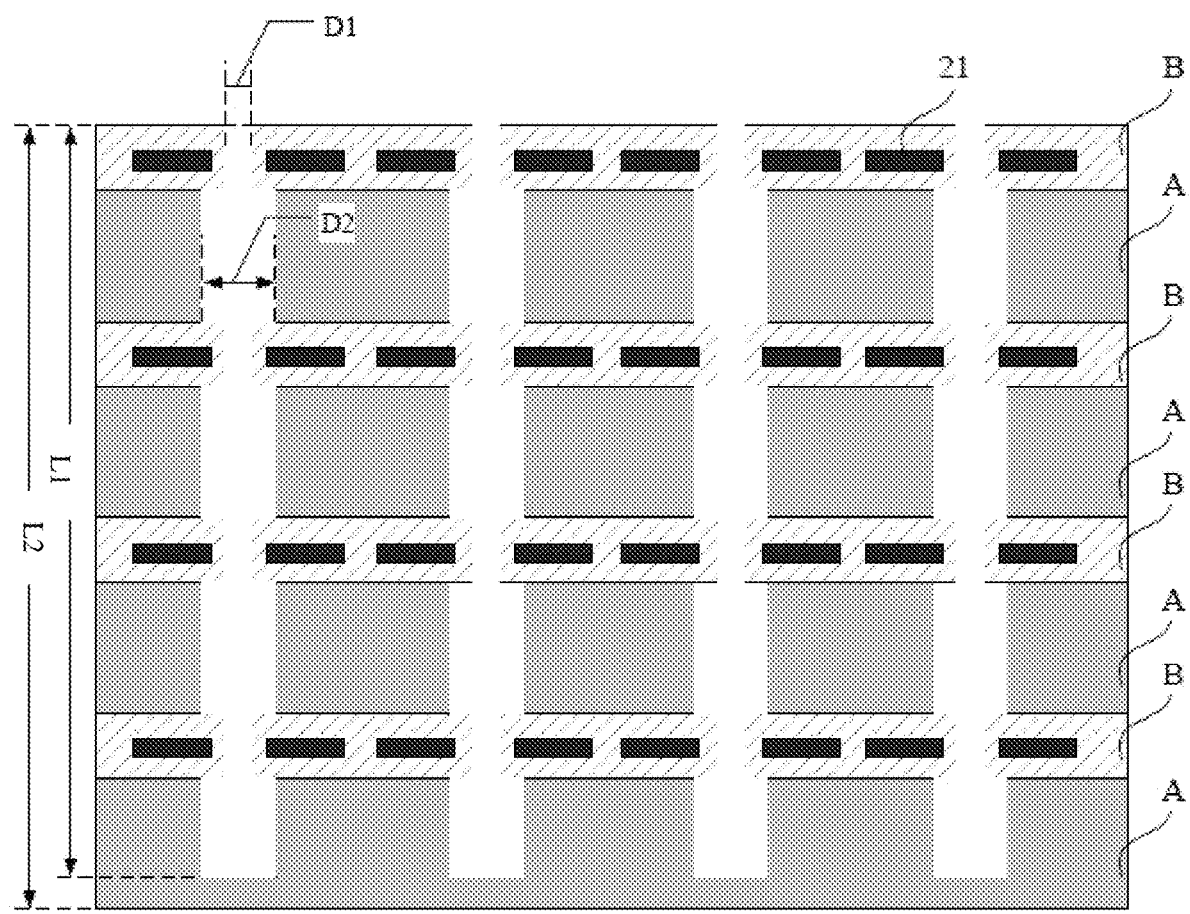
FIGS. 4A, 4B, 4C, and 4D are schematic diagrams of the structures in step S106 in an embodiment of the present disclosure.
Figure 4B:
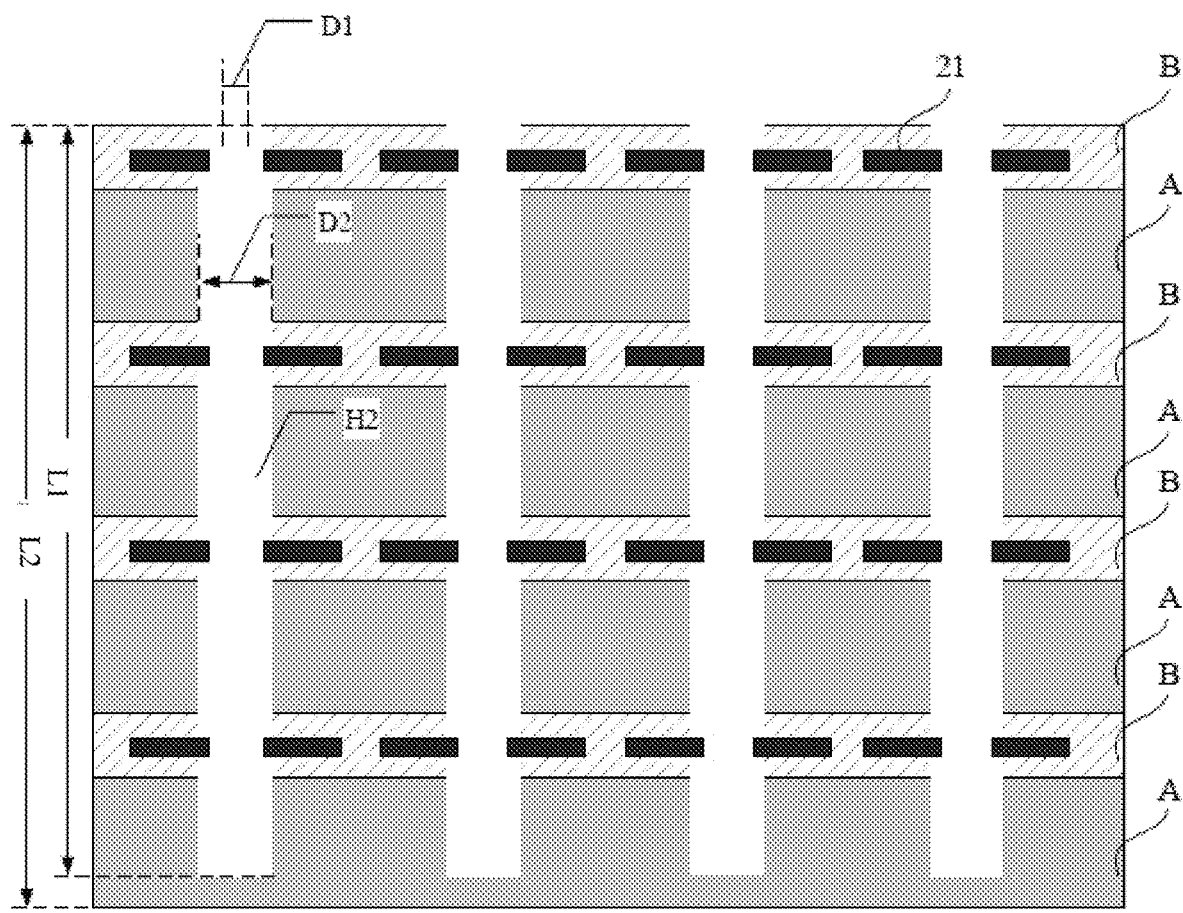

As shown in FIG. 4A and FIG. 4B, in Step S106, a second blind hole H2 having a second diameter D2 and the first length L1 is formed coaxially with the first blind hole H1, such that the sidewall of the second blind hole H2 exposes the end surfaces of the metal wires 21. Wherein, the second diameter D2 is larger than the space DL of the metal wires.

Referring to FIG. 4A, first, the portion of the first blind hole H1 located in the substrate A of each layer of wafer or die may be widened to the second diameter D2 by a first wet etching process. The first wet etching process may be performed, for example, by injecting a first predetermined dose of the first etching solution into the first blind hole H1 to etch the substrate A by an etching width of D2−D1, and the type and the dose of the first etching solution may be determined according to the type of the substrate and the etching width.

Referring to FIG. 4B, on the basis of the process shown in FIG. 4A, the portion of the first blind hole located in the wiring layer B of each layer of wafer or die is expanded to the second diameter D2 by a second wet etching process to expose the end surfaces of the metal wires 21 to form the second blind hole H2. The second wet etching process is performed, for example, by injecting a second predetermined amount of the second etching solution into the first blind hole H1 to etch the dielectric portion of the wiring layer B by the etching width of D2−D1. The type and the dose of the second etching solution may be determined according to the type of the dielectric portion and the etching width, and the dielectric portion may be, for example, $SiO_2$ or $Si_3N_4$.

As shown in FIGS. 4A and 4B, the second diameter D2 may be determined according to the space DL between the metal wires as long as the difference between D2 and DL is within a preset range and the end surfaces of the metal wires 21 are exposed.

Figure 4C:
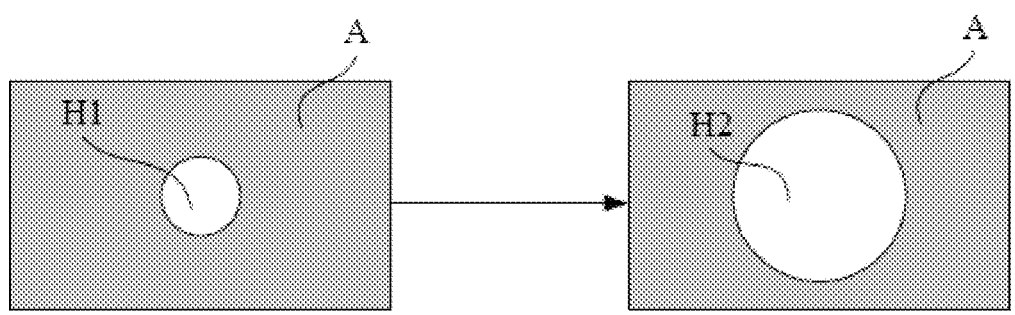
Figure 4D:
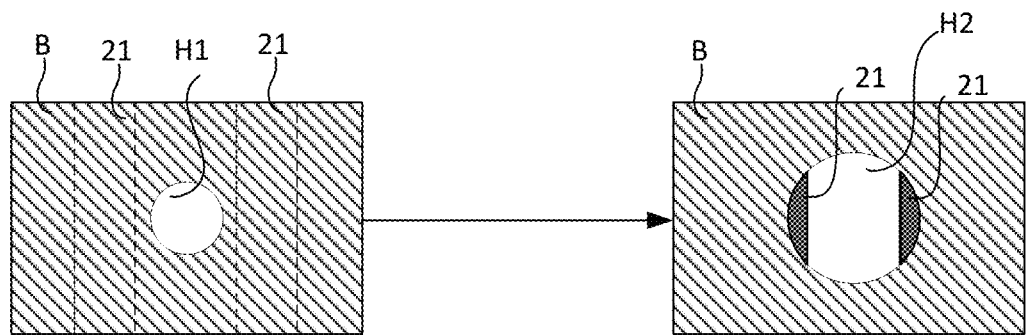

FIGS. 4C and 4D are cross-sectional top views of the first blind hole H1 and the second blind hole H2 in the processes shown in FIGS. 4A and 4B. Referring to FIG. 4C, in the process shown in FIG. 4A, the diameter of the blind hole in the substrate A is increased from D1 to D2. Referring to FIG. 4D, in the process shown in FIG. 4B, after the blind hole diameter is enlarged, the dielectric portion of the wiring layer B is etched off to expose the end surfaces of the metal wires 21. Although FIG. 4C and FIG. 4D are examples in which the cross-sectional top views of the first blind hole H1 and the second blind hole H2 are in circular shapes, in other embodiments of the present disclosure, the cross-sectional top views of the first blind hole and the second blind hole may have other shapes including a polygon, an irregularity, a parallelogram (diamond or square), and rounded quadrilateral, etc., which are not particularly limited in the present disclosure.

FIGS. 5A, 5B, 5C, 5D, 5E, 5F, and 5G are schematic diagrams of the second blind hole filled with conductive materials in Step S108.

Figure 5A:
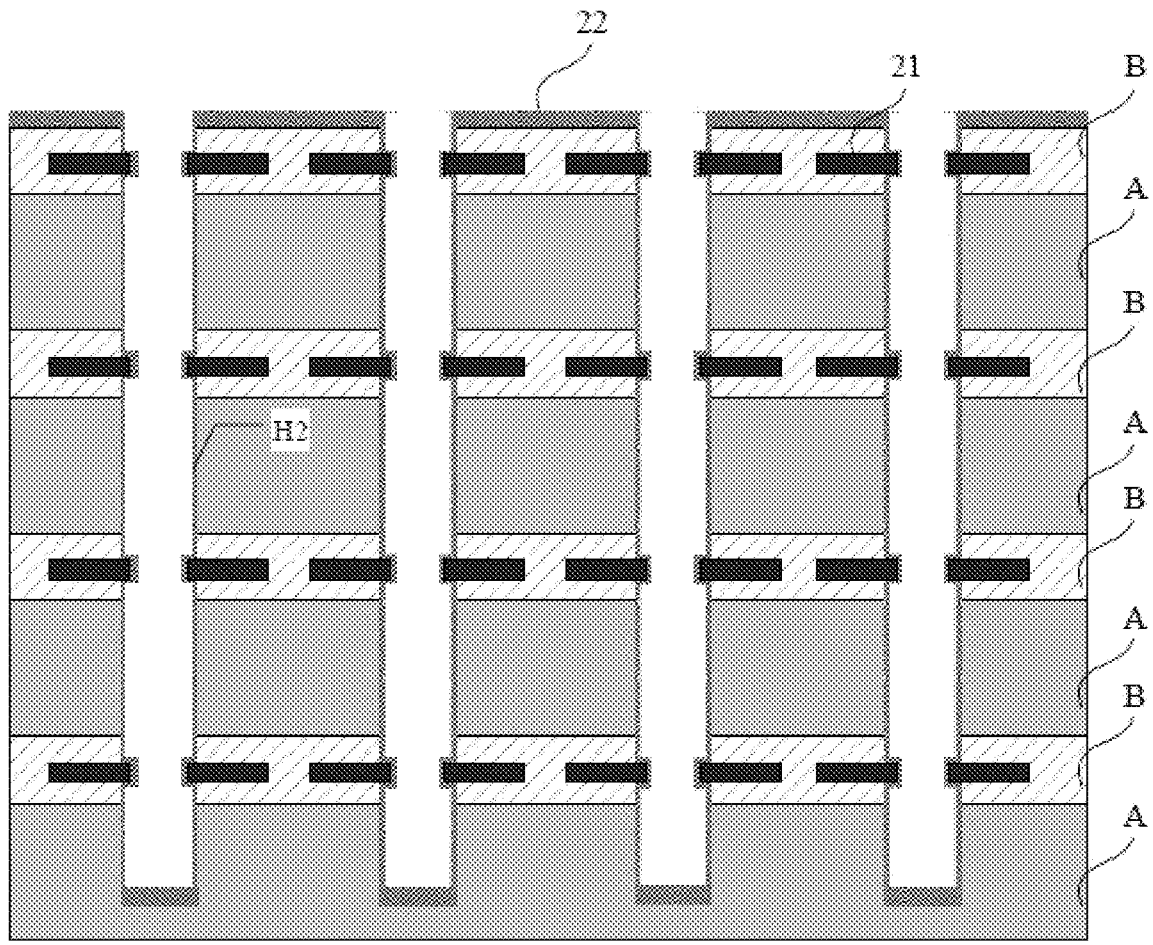
FIGS. 5A, 5B, 5C, 5D, 5E, 5F, and 5G are schematic diagrams of the structures in step S108 in an embodiment of the present disclosure.

In FIG. 5A, a dielectric isolation layer 22 may be formed on the inner surface of the second blind hole before filling a conductive material in the second blind hole. The process of fabricating the dielectric isolation layer 22 may be, for example, depositing SiCN on the surface of the etched surfaces of the second blind hole by a chemical vapor deposition process, such that the dielectric isolation layer 22 covers the inner surfaces of the one or more second blind holes H2 and the top surface of the stacked structure 200. In some embodiments, the materials of the dielectric isolation layer may also include insulating materials of an outer layer, which include, but not limited to, tantalum, tantalum nitride, silicon oxycarbide, silicon carbide, silicon nitride, and the like.

Figure 5B:
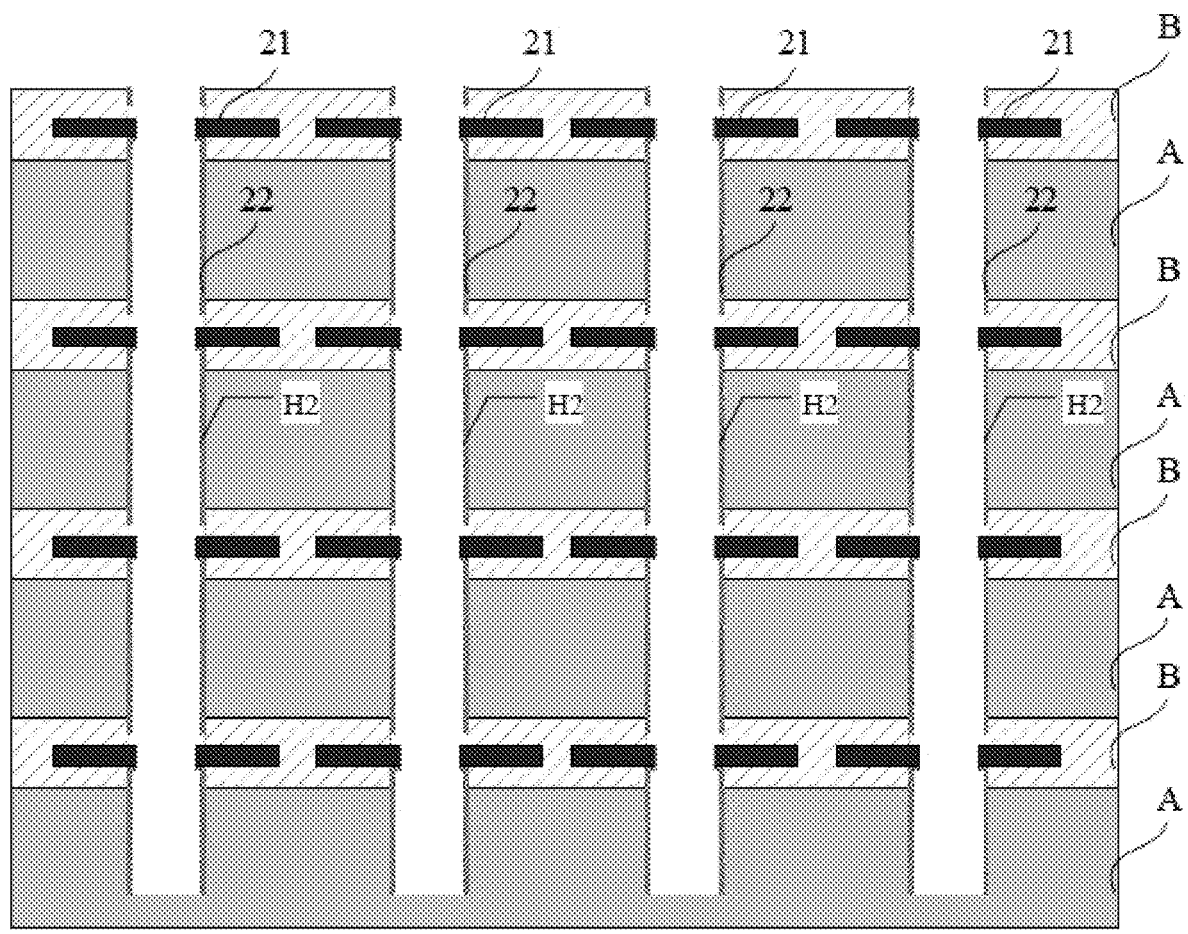

In FIG. 5B, the dielectric isolation layer 22 of FIG. 5A is etched to expose the end surfaces of the metal wires 21 within the second blind hole and the bottom of the second blind hole.

Figure 5C:
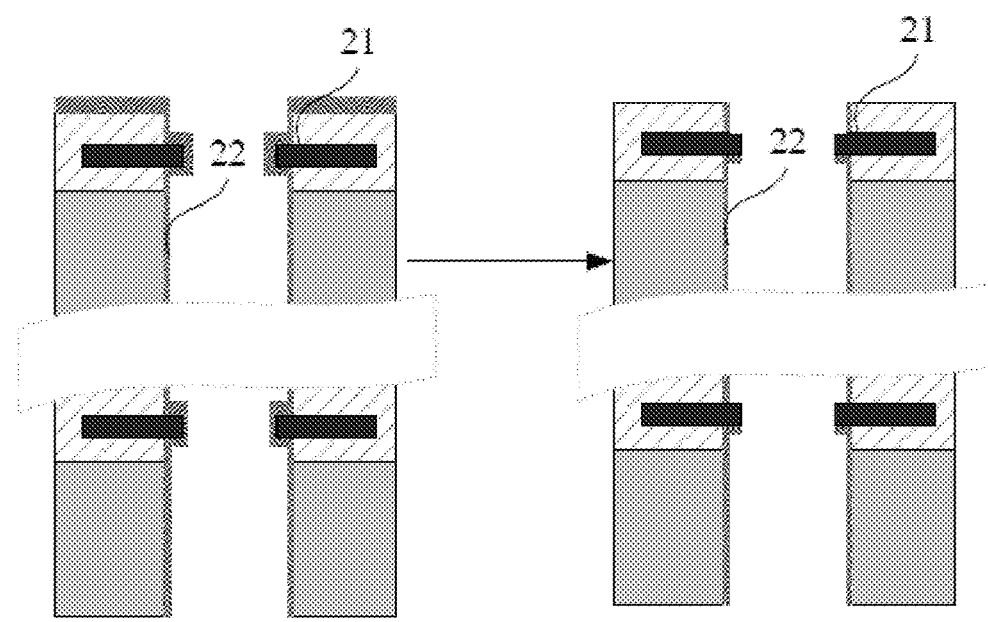

FIG. 5C is an enlarged view of the structure shown in FIG. 5B. Referring to FIG. 5C, the dielectric isolation layer 22 on the metal wires can be etched by a plasma dry etching process to expose the end surfaces and/or partial upper surfaces of the metal wires 21 and the bottom of the second blind hole H1 (i.e., the portion of the bottom visible in the cross-sectional top view). At this time, the positions of the metal wires in the cross-sectional top view of the second blind hole are the same as those in FIG. 4B, such that the dielectric isolation layer on the lower surfaces of the metal wires cannot be seen.

Figure 5D:
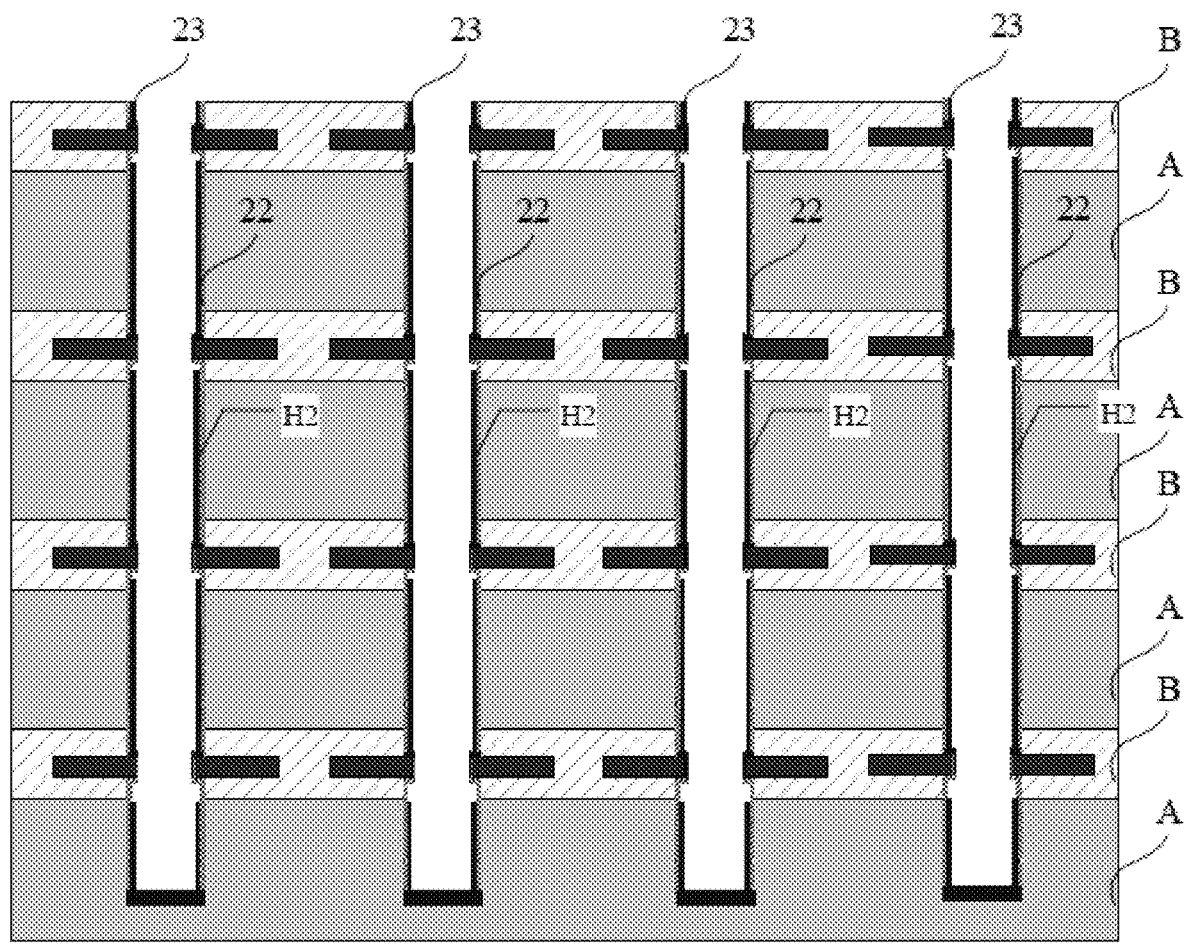
Figure 5E:
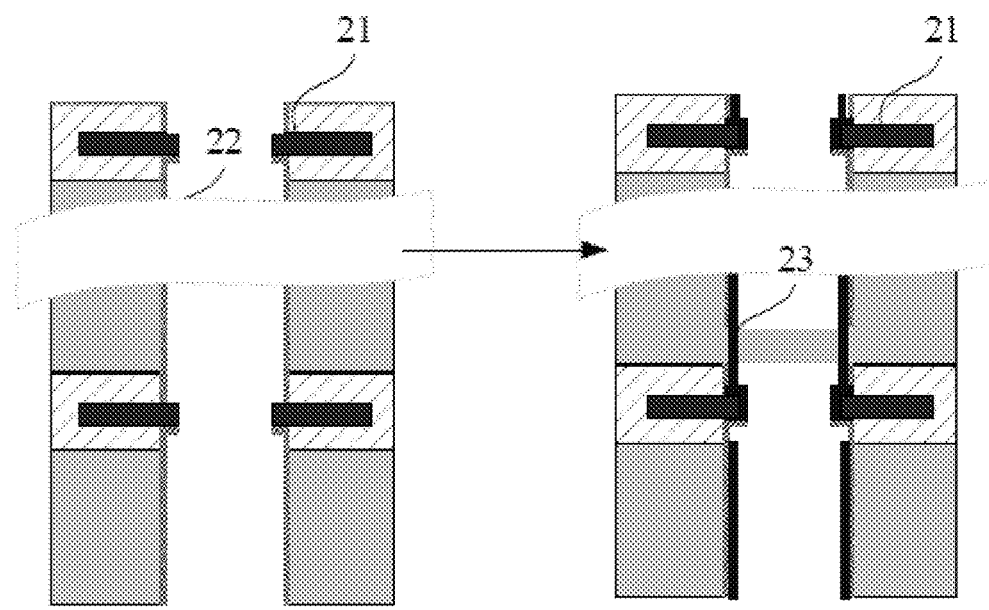

FIG. 5D is an illustration of a seed metal 23 sputtered on the inner sidewall and bottom of the second blind hole. The seed metals may include, for example, copper. FIG. 5E is an enlarged view of the structure shown in FIG. 5D. Referring to FIG. 5E, the seed metal 23 may be sputtered on positions including the sidewall of the second blind hole, upper surfaces and side surfaces of the exposed metal wires, and the bottom of the second blind hole, so that the subsequently filled copper may be connected with the metal wires via the tantalum or copper disposed on the metal wires.

Figure 5F:
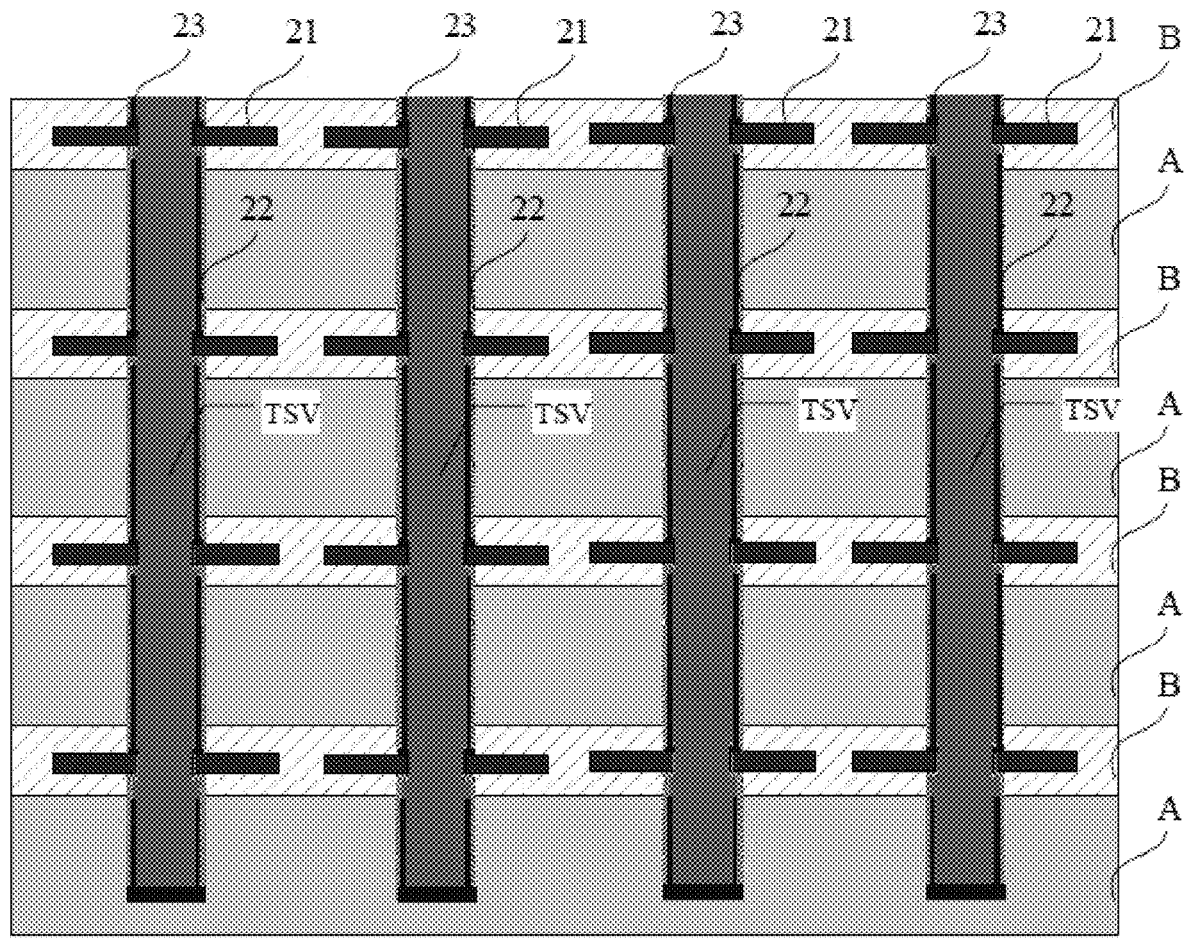

FIG. 5F is an illustration of a conductive metal grown in the second blind hole. The second blind hole may be filled with the conductive metal on the surfaces of the seed metal 23, and the top surface of the conductive metal is aligned with the top surface of the wiring layer B to form the TSVs. The conductive metal may include, for example, copper or tungsten, and the process of growing the metal may be, for example, electroplating.

Figure 5G:
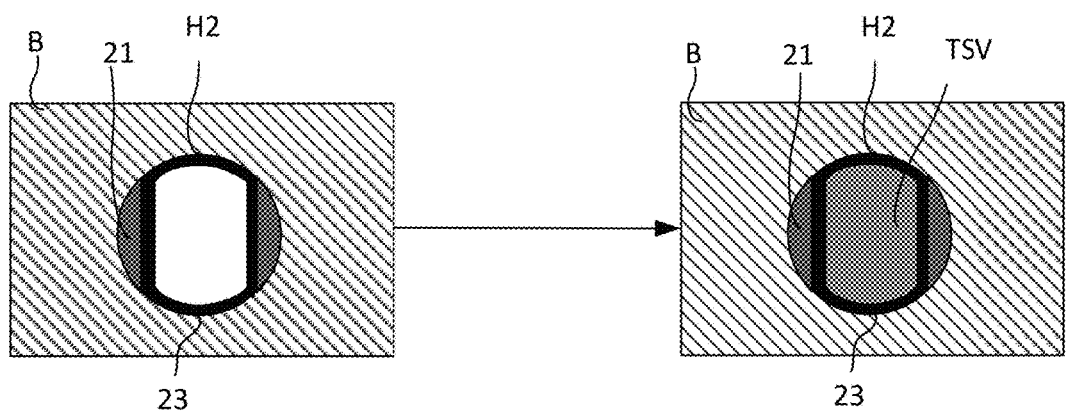

FIG. 5G is a cross-sectional top view of the structure shown in FIG. 5F.

Figure 6A:
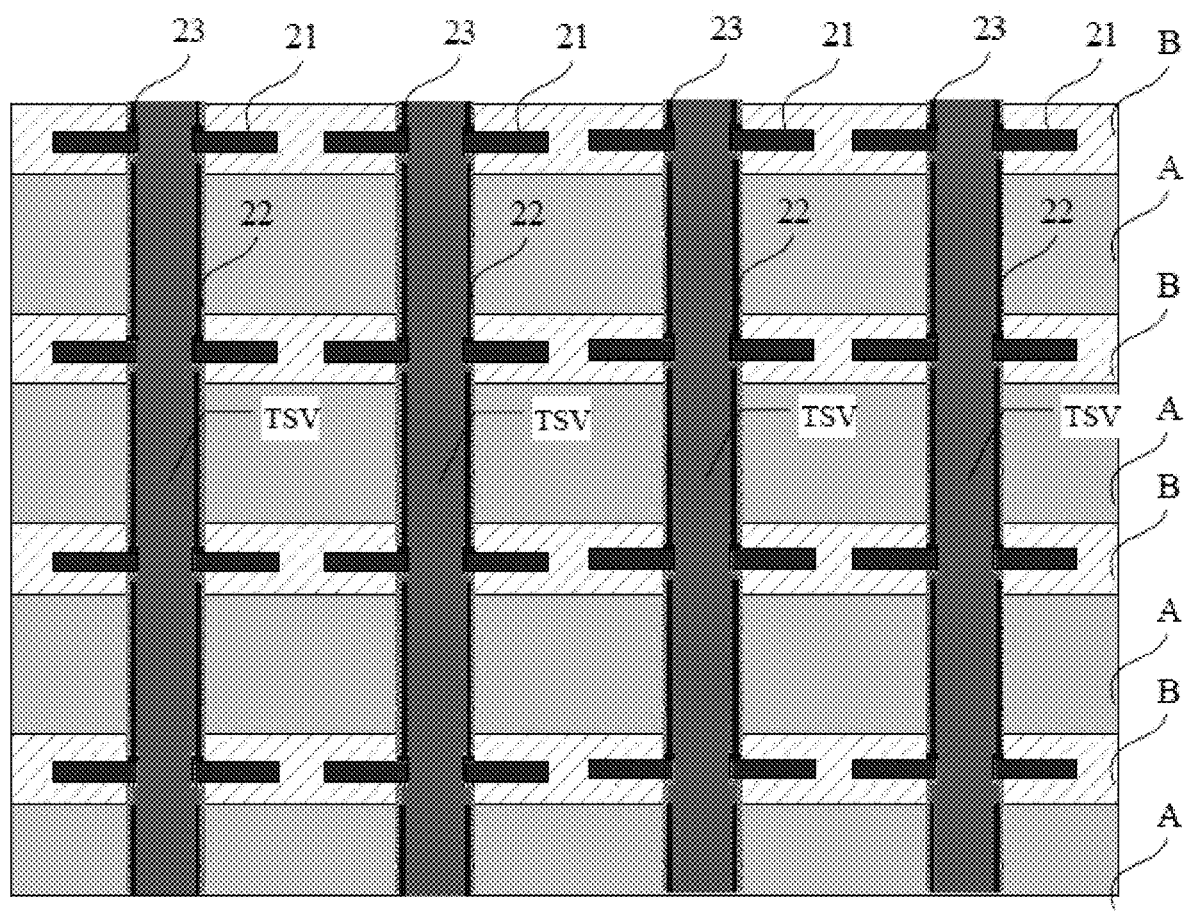
FIGS. 6A and 6B are schematic diagrams of the structures in step S110 in an embodiment of the present disclosure.
Figure 6B:
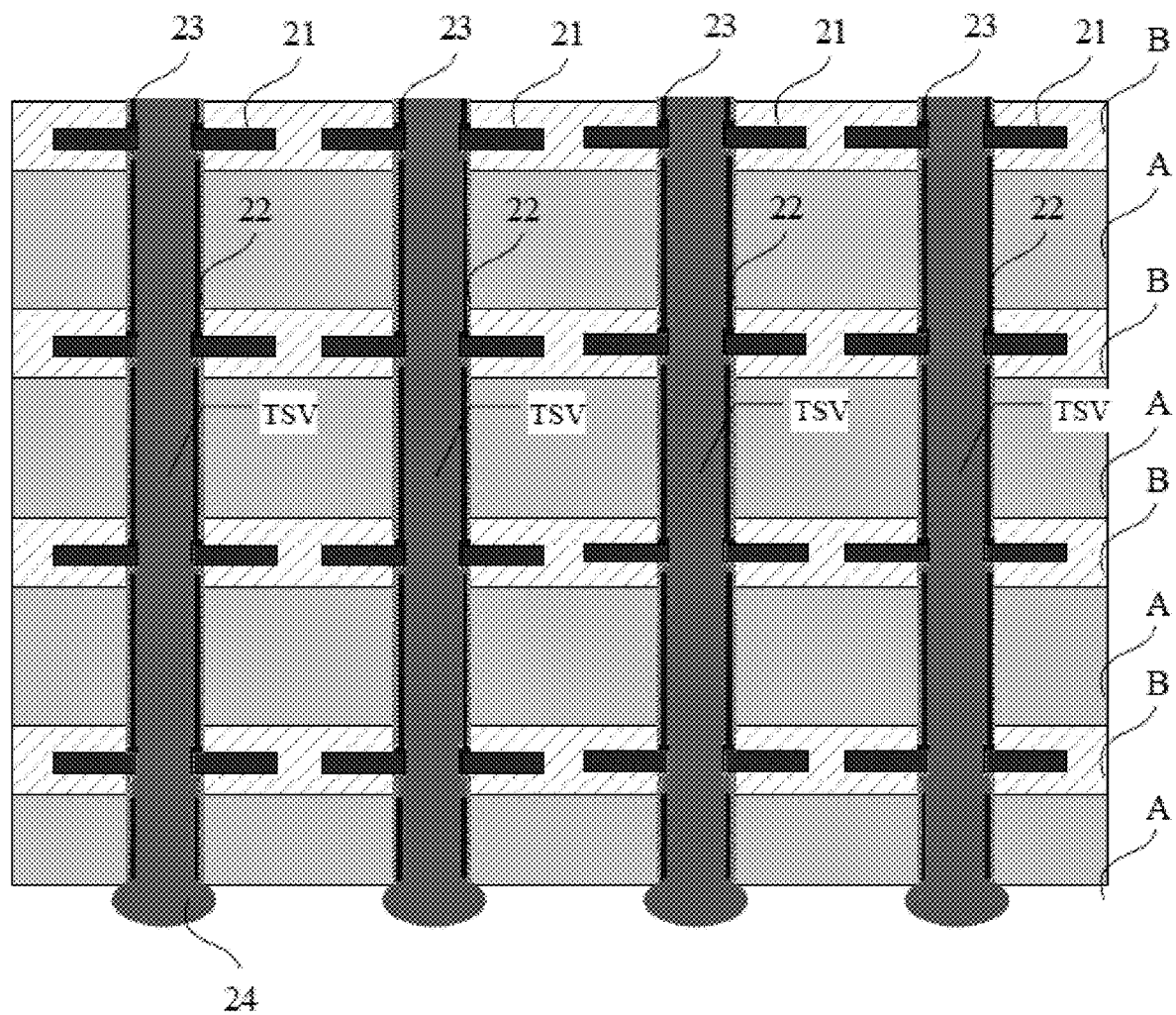

FIGS. 6A and 6B are schematic diagrams showing the structure in Step S110 of the method in one embodiment of the present disclosure.

As shown in FIG. 6A, Step S110 may include grinding the bottom layer of the stacked structure to expose the metal filled on the bottom of the second blind hole. A bump 24 is formed on the exposed surface of the metal as shown in FIG. 6B. The process disclosed in the present disclosure may fabricate the structures that can interconnect with other stacked structures.

Through the above process, the TSVs may be formed in a simple process and electrically connect the metal wires among layers of wafer or die. This can overcome the shortcomings of electrical connections through bumps in the related art, such as complicated process, high cost, and low yield, and can improve the manufacturing efficiency of the 3D integrated circuit.

Figure 7:
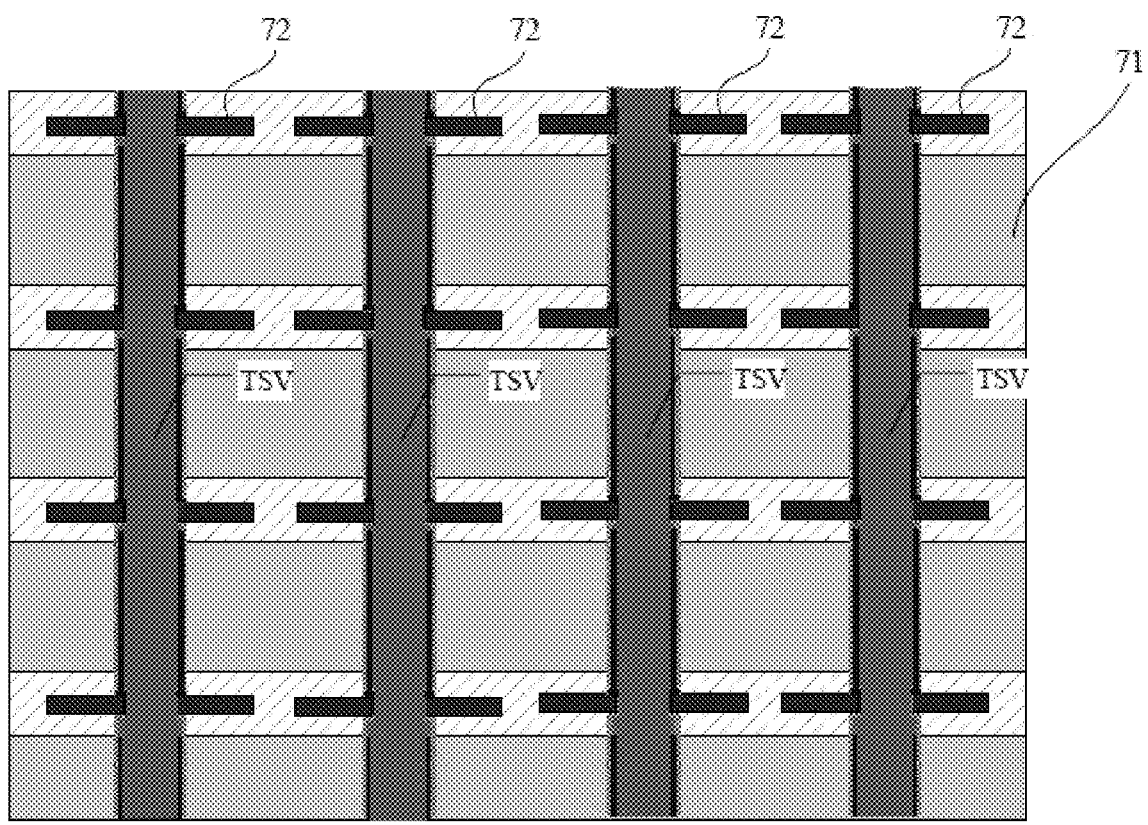
FIG. 7 is a schematic diagram of a semiconductor interconnect structure according to an embodiment of the present disclosure.

FIG. 7 is a schematic diagram of a semiconductor interconnect structure according to an embodiment of the present disclosure.

Referring to FIG. 7, the semiconductor interconnect structure 700 may include a stacked structure 71. The stacked structure 71 may include bonded multiple layers of wafer or die. Each layer of wafer or die may include a substrate and a wiring layer, and the wiring layer may include a plurality of metal wires 72.

The semiconductor interconnect structure 700 may include TSVs penetrating through the stacked structure 71, and the centers of the penetrating positions on each layer of wafer or die may be located between the adjacent metal wires 72. The sidewalls of the TSVs may intersect with the metal wires 72, and the end surfaces of the metal wires 72 may extend into the TSVs. The TSVs may be fabricated by the method for fabricating a semiconductor interconnection structure disclosed above referring to FIGS. 2 to 5F. The main body of the TSV may include metals such as copper and tungsten, and the outer insulating material may include tantalum, tantalum nitride, silicon carbonitride, silicon oxycarbide, silicon carbide, silicon nitride, etc. The cross-sectional top views of the TSVs may be, but not limited to, shapes of a circle, a quadrangle (square, rectangle, parallelogram, diamond), a polygon, and other irregular shapes including a jagged shape.

The semiconductor interconnect structure disclosed in the embodiments of the present disclosure does not have bumps between the layers of chip, and the structure among the multiple layers of chips can be fabricated by one single TSV process, thereby avoiding the problems caused by the inter-chip electrical connections with bumps in the related art, such as misalignments and connection defects, and improving the efficiency and yield of manufacturing 3D integrated circuits.

Further, the annexed figures are merely illustrative of a series of processes included in the method according to embodiments of the present disclosure and are not limiting. It will be appreciated that the way in which the processes are illustrated does not indicate any chronological order of them or limit them to a particular chronological order. Furthermore, it will also be appreciated that the processes may be performed, for example, synchronously or asynchronously in multiple modules.

Other embodiments of the present disclosure will be apparent to those skilled in the art from considering the specification and practicing the invention disclosed herein. Accordingly, this present disclosure covers all and any variations, uses, or adaptations of the present disclosure which follow, in general, the principles thereof and include any departures from the present disclosure as come within common knowledge or customary practice within the art to which the present disclosure pertains. The specification and examples are exemplary only, and the true scope and spirit of the present disclosure are indicated by the appended claims.

The invention claimed is:

1. A method for fabricating a semiconductor interconnect structure, comprising:
   providing a stacked structure comprising bonded a plurality of layers of wafer or die, wherein each layer of wafer or die comprises a substrate and a wiring layer, and the wiring layer comprises a plurality of metal wires;
   vertically forming, in the stacked structure, a first blind hole having a first diameter and a first length, wherein a penetration position of the first blind hole in each layer of wafer or die is between adjacent metal wires, the first diameter is less than a space between the adjacent metal wires, and the first length is less than a height of the stacked structure;

forming a second blind hole having a second diameter and the first length coaxially with the first blind hole, wherein a sidewall of the second blind hole exposes end surfaces of the plurality of metal wires, and the second diameter is larger than the space between the adjacent metal wires; and filling a conductive material in the second blind hole.

2. The method of claim 1, wherein forming the second blind hole having the second diameter and the first length coaxially with the first blind hole comprises:

widening a portion of the first blind hole in the substrate of each layer of wafer or die to the second diameter by a first wet etch process; and extending, by a second wet etching process, a portion of the first blind hole in the wiring layer of each layer of wafer or die to the second diameter to expose the end surfaces of the plurality of metal wires to form the second blind hole.

3. The method of claim 2, wherein filling the conductive material in the second blind hole comprises:

forming a dielectric isolation layer on an inner surface of the second blind hole; and etching the dielectric isolation layer to expose the end surfaces of the plurality of metal wires and a bottom of the second blind hole.

4. The method of claim 3, wherein forming the dielectric isolation layer comprises depositing SiCN on the inner surface of the second blind hole by a chemical vapor deposition process.

5. The method of claim 3, wherein etching the dielectric isolation layer to expose the end surfaces of the plurality of metal wires and the bottom of the second blind hole comprises:

etching, by a plasma dry etch process, portions of the dielectric isolation layer on the end surfaces and upper surfaces of the plurality of metal wires to expose the plurality of metal wires, and etching a portion of the dielectric isolation layer at the bottom of the second blind hole to expose the bottom of the second blind hole.

6. The method of claim 5, wherein filling the conductive material in the second blind hole comprises:

sputtering a seed metal on the etched dielectric isolation layer and the exposed end surfaces of the plurality of metal wires and the bottom of the second blind hole, wherein the seed metal comprises tantalum or copper; and growing the conductive metal in the second blind holes sputtered with the seed metal, the conductive metal comprises copper.

7. The method of claim 1, further comprising:

grinding a bottom layer of the stacked structure to expose a metal filled at a bottom of the second blind hole; and forming a bump on a surface of the exposed metal.

8. The method of claim 1, wherein each of the first blind hole and the second blind hole has a cross-sectional top view of a circle shape, a polygon shape, and an irregular shape.

9. The method of claim 1, wherein the plurality of layers of wafer or die are directly bonded, wherein a substrate of a top layer is directly disposed on a wiring layer of a lower layer.

10. The method of claim 1, wherein a difference between the first diameter and the space between the adjacent metal wires is within a first preset safe range, and a difference between the second diameter and the space between the adjacent metal wires is within a second preset safe range.

* * * * *